United States Patent [19]
Chu et al.

[11] Patent Number: 6,110,782
[45] Date of Patent: Aug. 29, 2000

[54] METHOD TO COMBINE HIGH VOLTAGE DEVICE AND SALICIDE PROCESS

[75] Inventors: Wen-Ting Chu, Kaoshiung; Chuan-Li Chang, Hsin-Chu; Ming-Chon Ho, Taichuang; Chang-Song Lin, Hsin-Chu; Di-Son Kwo, Hsinchu, all of Taiwan

[73] Assignee: Taiwan Semiconductor Manufacturing Company, Hsin-Chu, Taiwan

[21] Appl. No.: 09/195,651

[22] Filed: Nov. 19, 1998

[51] Int. Cl.⁷ .................. H01L 21/8247; H01L 21/8234
[52] U.S. Cl. ............. 438/275; 257/501; 438/258; 438/241
[58] Field of Search .................. 438/258, 275, 438/241; 257/500, 501

[56] References Cited

U.S. PATENT DOCUMENTS

| | | | |
|---|---|---|---|
| 5,158,902 | 10/1992 | Hanada . | |
| 5,482,888 | 1/1996 | Hsu et al. | 437/70 |
| 5,512,503 | 4/1996 | Hong | 437/43 |
| 5,538,912 | 7/1996 | Kunori et al. . | |
| 5,656,527 | 8/1997 | Choi et al. | 438/258 |
| 5,663,084 | 9/1997 | Yi et al. | 438/453 |
| 5,721,170 | 2/1998 | Bergemont | 438/303 |
| 5,776,811 | 7/1998 | Wang et al. | 438/264 |
| 5,789,293 | 8/1998 | Cho et al. | 438/257 |
| 5,789,294 | 8/1998 | Choi | 438/258 |
| 5,956,591 | 9/1999 | Fulford, Jr. | 438/305 |
| 6,015,730 | 1/2000 | Wang et al. | 438/241 |
| 6,037,222 | 3/2000 | Huang et al. | 438/257 |

*Primary Examiner*—Richard Booth
*Attorney, Agent, or Firm*—George O. Saile; Stephen B. Ackerman; Rosemary L. S. Pike

[57] ABSTRACT

A method for integrating salicide and high voltage device processes in the fabrication of high and low voltage devices on a single wafer is described. Isolation areas are formed on a semiconductor substrate surrounding and electrically isolating a low voltage device area from a high voltage device area. A gate oxide layer is grown in the device areas. A polysilicon layer is deposited overlying the gate oxide layer and isolation areas. A first photomask is formed over a portion of the high voltage device area wherein the first photomask also completely covers the low voltage device area. The polysilicon layer is etched away where it is not covered by the photomask to form a high voltage device. Ions are implanted to form lightly doped source and drain regions within the semiconductor substrate adjacent to the high voltage device wherein the first photomask protects the polysilicon layer in the low voltage device area from the ions. The first photomask is removed. A second photomask is formed over a portion of the low voltage device area where a gate electrode is to be formed wherein the second photomask also completely covers the high voltage device area. The polysilicon layer not covered by the second photomask is etched away to form the gate electrode. The second photomask is removed. The low voltage and high voltage area devices are silicided and the fabrication of the integrated circuit device is completed.

20 Claims, 3 Drawing Sheets

METHOD TO COMBINE HIGH VOLTAGE DEVICE AND SALICIDE PROCESS

BACKGROUND OF THE INVENTION

(1) Field of the Invention

The present invention relates to the fabrication of integrated circuit devices, and more particularly, to a method of integrating high voltage device fabrication with low voltage salicide processes in the fabrication of integrated circuits.

(2) Description of the Prior Art

In the fabrication of integrated circuit devices, logic products are often produced using salicide (self-aligned silicide) processes in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance.

With the advent of Large Scale Integration (LSI), many of the integrated circuits formed on semiconductor substrates comprise several circuit functions on a single chip. For example, memory devices are formed on the same chip as the logic circuits which address them. High voltage devices are required to program or erase a non-volatile memory cell. However, the polysilicon thickness in the salicide process is not enough to resist the high energy ion implant required for a high voltage device. Logic devices and memory devices can have both high and low voltage devices. It is desired to find a method of integrating the salicide process with the fabrication of high voltage devices on one wafer so that high performance of both low voltage devices and high voltage devices can be achieved.

U.S. Pat. No. 5,512,503 to Hong discloses a split gate EEPROM device. U.S. Pat. Nos. 5,482,888 to Hsu et al, 5,721,170 to Bergemont, and 5,776,811 to Wang et al teach various methods of forming high voltage devices. Co-pending U.S. patent application Ser. No. 08/998,630 to J. M. Huang et al, filed on Dec. 29, 1997 teaches a method of integrating salicide and self-aligned contact processes in the fabrication of logic circuits with embedded memory.

SUMMARY OF THE INVENTION

Accordingly, it is a primary object of the present invention to provide an effective and very manufacturable method for integrating salicide and high voltage device processes in the fabrication of integrated circuits.

It is a further object of the invention to provide a process for integrating salicide and high voltage device processes in the fabrication of logic circuits with embedded memory.

Yet another object is to form high voltage memory devices in the memory circuits of an integrated circuit device while also forming salicided gate electrodes and source/drain regions in the logic circuits of the same integrated circuit device.

Yet another object is to form high voltage devices of an integrated circuit device while also forming salicided gate electrodes and source/drain regions in the low voltage circuits of the same integrated circuit device.

A still further object is to form high voltage devices of an integrated circuit device while preventing ion implantation penetration of the polysilicon region in the low voltage circuits of the same integrated circuit device.

A still further object is to form high voltage memory devices in the memory circuits of an integrated circuit device while preventing ion implantation penetration of the polysilicon region in the logic circuits of the same integrated circuit device.

In accordance with the objects of the invention, a method for integrating salicide and high voltage device processes in the fabrication of integrated circuits is achieved. Isolation areas are formed on a semiconductor substrate surrounding and electrically isolating a low voltage device area from a high voltage device area. A gate oxide layer is grown in the device areas. A polysilicon layer is deposited overlying the gate oxide layer and isolation areas. A first photomask is formed over a portion of the high voltage device area wherein the first photomask also completely covers the low voltage device area. The polysilicon layer is etched away where it is not covered by the photomask to form a high voltage device. Ions are implanted to form lightly doped source and drain regions within the semiconductor substrate adjacent to the high voltage device wherein the first photomask protects the polysilicon layer in the low voltage device area from the ions. The first photomask is removed. A second photomask is formed over a portion of the low voltage device area where a gate electrode is to be formed wherein the second photomask also completely covers the high voltage device area. The polysilicon layer not covered by the second photomask is etched away to form the gate electrode. The second photomask is removed. Both high and low voltage devices are silicided and the fabrication of the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
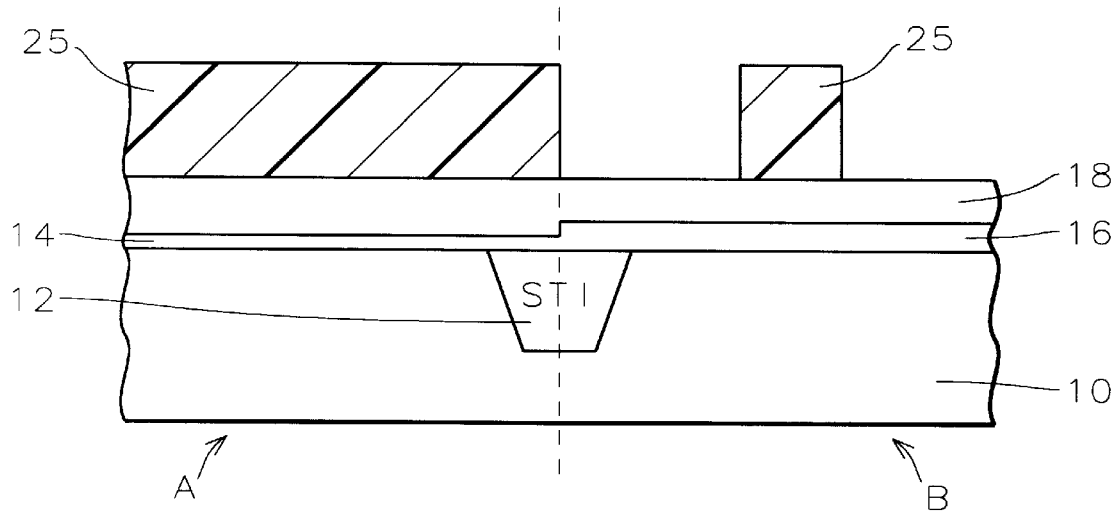
FIGS. 1 through 6 are cross-sectional representations of a preferred embodiment of the present invention.

Referring now more particularly to FIG. 1, there is shown a semiconductor substrate 10, preferably composed of monocrystalline silicon. Isolation regions are formed in and on the semiconductor substrate to separate active areas from one another. For example, local oxidation of silicon (LOCOS) or shallow trench isolation (STI) may be used. In the example illustrated, STI region 12 is formed in the semiconductor substrate. The substrate is shown to be divided by the dashed line into a low voltage side A on the left and a high voltage side B on the right. The chip is depicted in this way for clarity. It is to be understood that the chip layout can be other than that depicted. The important point is that both low and high voltage devices are to be fabricated on the same wafer.

First, a layer of gate oxide is grown over the surface of the substrate, typically to a thickness of between about 20 and 120 Angstroms 14 in the low voltage area A and to a thickness of between about 120 and 400 Angstroms 16 in the high voltage area B. Usually, the gate oxide is grown over the surface of the substrate. Photoresist covers the gate oxide in the "thick" oxide area. The oxide is removed in the "thin" oxide area and the photoresist is removed. Then a second gate oxide is grown, resulting in both "thick" and "thin" oxide areas on the same wafer.

A layer of polysilicon 18 is deposited over the gate oxide and field oxide regions to a thickness of between about 500 and 4000 Angstroms. Alternatively, this layer 18 may comprise amorphous silicon.

Figure 2:
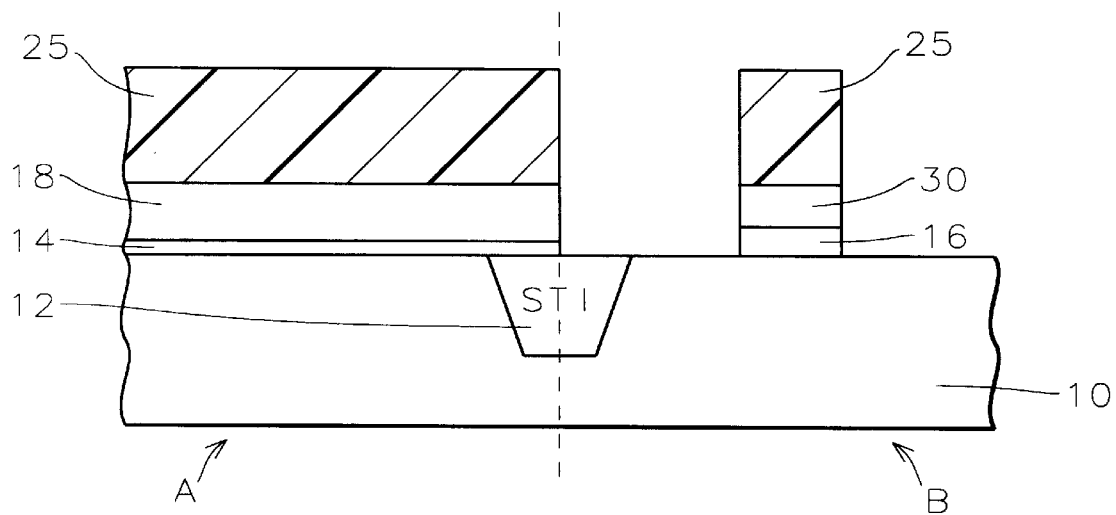

A layer of photoresist is coated over the substrate, and exposed, developed, and patterned to form the photoresist mask 25 to define the high voltage devices. The mask also completely covers the low voltage portion A of the wafer. The polysilicon layer is etched away where it is not covered by the mask 25 to form the high voltage device, such as 30, as shown in FIG. 2. The high voltage device 30 may be a memory device, such as in an erasable electrically programmable read-only memory (EEPROM) device. The high voltage device may be a logic circuit or a periphery circuit.

Figure 3:
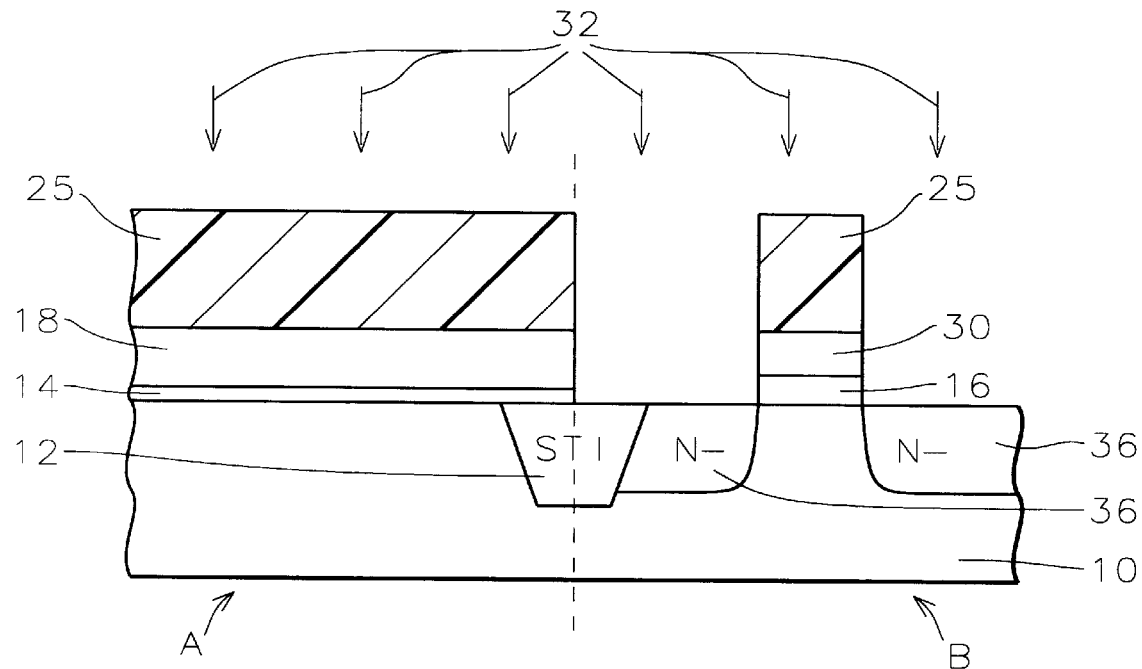

Now, a key feature of the present invention will be described with reference to FIG. 3. The photoresist mask 25 used to pattern the high voltage devices is left on the wafer and used as a block out mask for the high voltage ion implant. In this way, the high voltage implant is self-aligned. No additional photomasking step is required. Importantly, the low voltage areas in section A are protected from the high voltage implant by the block out mask.

Phosphorus or boron ions 32 are implanted into the high voltage portion B of the substrate, for example, at a dosage of between about 5 E 12 and 5 E 14 atoms/cm$^2$ and energy of between about 40 and 200 KeV, to form N− regions 36.

Figure 4:
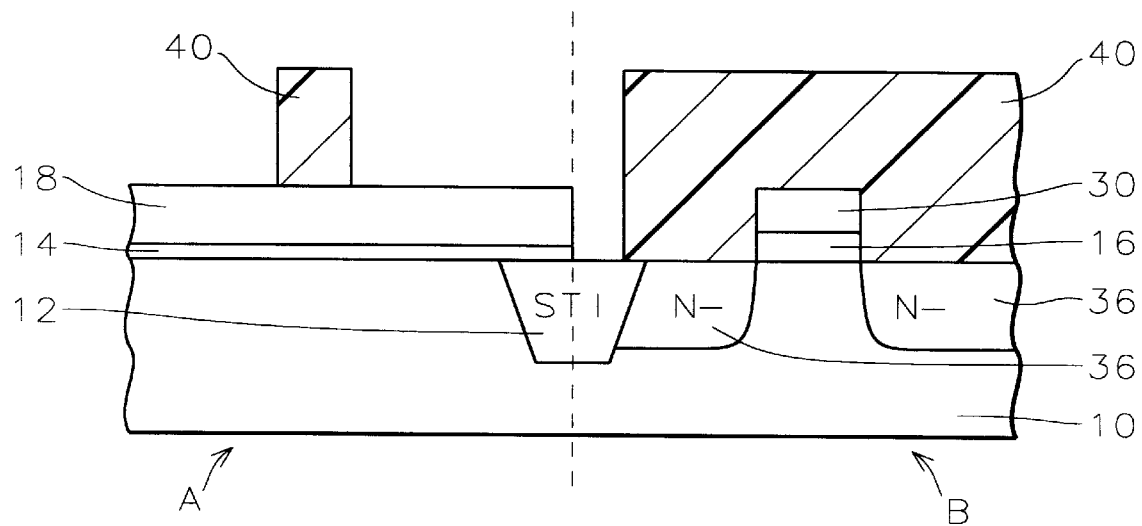
Figure 5:
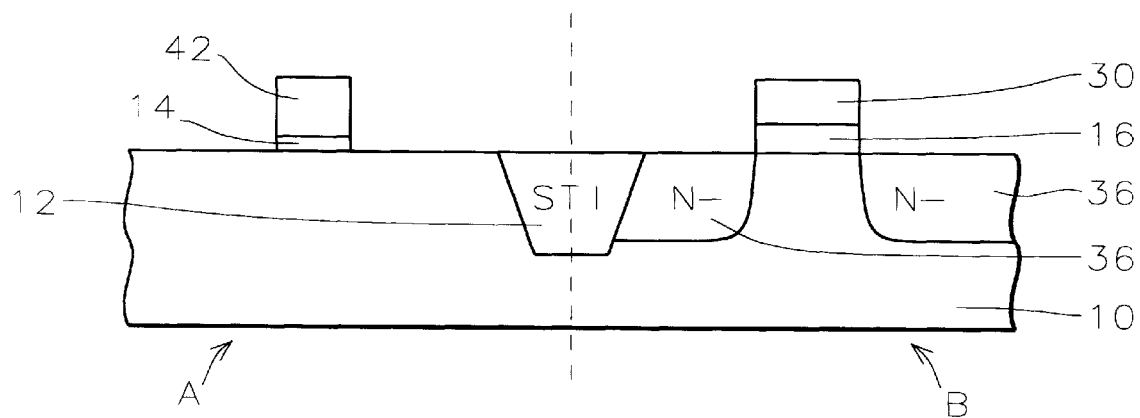
Figure 6:
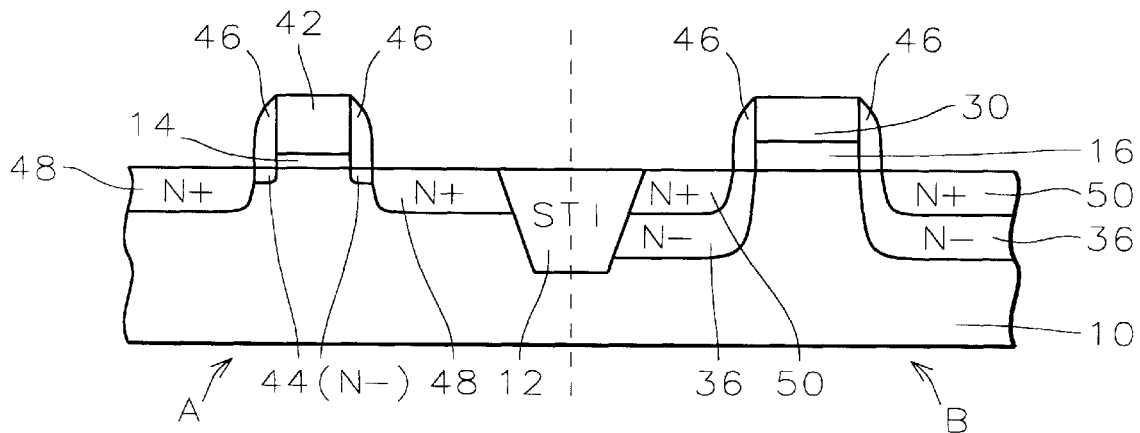

The photomask 25 is stripped. Next, referring to FIG. 4, a photoresist mask 40 is formed over the substrate to define the low voltage devices. The mask also completely covers the high voltage side B of the wafer. The polysilicon layer 18 is etched away where it is not covered by the mask 40 to form the gate electrodes, such as 42, as illustrated in FIG. 5.

The LDD implant to form the transistor lightly doped regions 44 is performed at this time. Both NLDD and PLDD regions are formed using appropriate photomasking, as is conventional. A dielectric layer of silicon oxide or silicon nitride is deposited over the surface of the substrate and anisotropically etched back to leave spacers 46 on the sidewalls of the gate electrodes 42 and 30.

Ion implantations are performed to form heavily doped source and drain regions 48 and 50. Source/drain regions 48 and 50 may be N+ or P+ regions for NMOS and PMOS.

Figure 7:
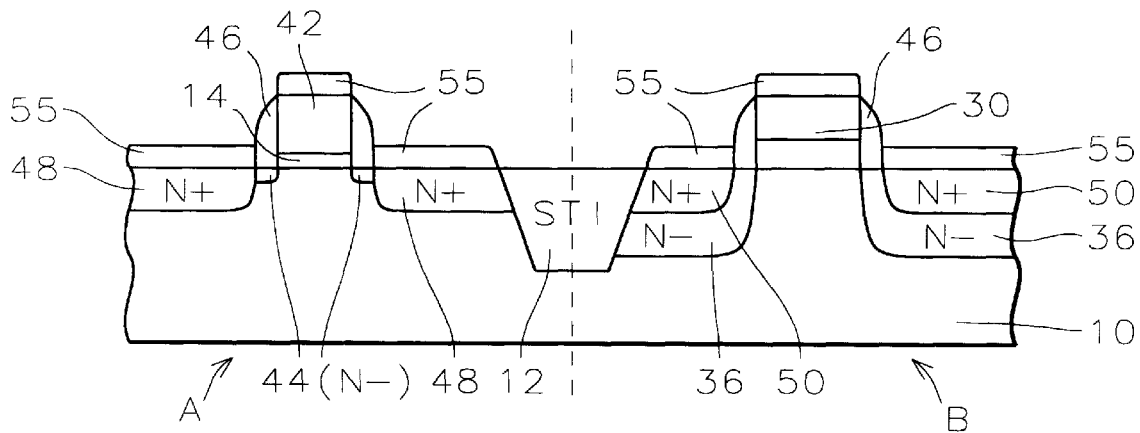
FIG. 7 is a cross-sectional representation of a completed integrated circuit device fabricated using the process of the present invention.

Referring now to FIG. 7, the salicidation of both the low voltage portion A and the high voltage portion B of the wafer is performed, as conventional in the art. For example, a titanium or titanium/titanium nitride layer is sputter deposited over the wafer surface and annealed. The titanium layer overlying silicon surfaces is transformed to titanium silicide. The unreacted titanium over the oxide or nitride areas is removed, leaving silicided gate electrodes and source/drain regions. Silicided regions 55 are shown in FIG. 7.

The process of the present invention integrates the high voltage device fabrication with the salicide process so that both high and low voltage devices can be fabricated together on the same wafer. The process of the invention results in high performance of low voltage circuits that are not subject to polysilicon high voltage implant damage. The self-aligned high voltage ion implant both protects the low voltage portion of the wafer and saves an additional photomasking step.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

forming isolation areas on a semiconductor substrate surrounding and electrically isolating device areas, said device areas being a low voltage device area and a high voltage device area;

providing a gate oxide layer in said device areas;

depositing a polysilicon layer overlying said gate oxide layer and said isolation areas;

forming a first photomask over a portion of said high voltage device area wherein said first photomask also completely covers said low voltage device area;

etching away said polysilicon layer not covered by said first photomask to form said high voltage device;

thereafter implanting first ions to form lightly doped source and drain regions within said semiconductor substrate adjacent to said high voltage device wherein said first photomask protects said polysilicon layer in said low voltage device area from said ions;

removing said first photomask;

forming a second photomask over a portion of said low voltage device area where a gate electrode is to be formed wherein said second photomask also completely covers said high voltage device area;

etching away said polysilicon layer not covered by said second photomask to form said gate electrode;

removing said second photomask; and completing the fabrication of said integrated circuit device.

2. The method according to claim 1 wherein said isolation areas comprise local oxidation of silicon.

3. The method according to claim 1 wherein said isolation areas comprise shallow trench isolation.

4. The method according to claim 1 further comprising:

implanting second ions to form lightly doped source and drain regions within said semiconductor substrate associated with said gate electrode and said high voltage device;

forming spacers on the sidewalls of said gate electrode and said high voltage device;

implanting third ions to form heavily doped source and drain regions within said semiconductor substrate associated with said gate electrode and said high voltage device; and siliciding said gate electrode, said high voltage device, and said associated source and drain regions.

5. The method according to claim 1 wherein said step of implanting first ions comprising implanting phosphorus ions with a dosage of between about 5 E 12 and 5 E 14 atoms/cm$^2$ and energy of between about 40 and 200 KeV.

6. The method according to claim 1 wherein said step of implanting first ions comprising implanting boron ions with a dosage of between about 5 E 12 and 5 E 14 atoms/cm$^2$ and energy of between about 40 and 200 KeV.

7. A method of fabricating an integrated circuit device wherein a low voltage device area and a high voltage device area are fabricated on the same wafer comprising:

forming isolation areas on a semiconductor substrate surrounding and electrically isolating said device areas, said device areas being said low voltage device area and said high voltage device area;

providing a gate oxide layer in said device areas;

depositing a first conducting layer overlying said gate oxide layer and said isolation areas;

forming a first photomask over a portion of said high voltage device area wherein said first photomask also completely covers said low voltage device area;

etching away said conducting layer not covered by said first photomask to form said high voltage device;

thereafter implanting first ions to form lightly doped source and drain regions within said semiconductor substrate adjacent to said high voltage device wherein said first photomask protects said conducting layer in said low voltage device area from said ions;

removing said first photomask;

forming a second photomask over a portion of said low voltage device area where a gate electrode is to be formed wherein said second photomask also completely covers said high voltage device area;

etching away said conducting layer not covered by said second photomask to form said gate electrode;

removing said second photomask; and completing the fabrication of said integrated circuit device.

8. The method according to claim 7 wherein said isolation areas comprise local oxidation of silicon.

9. The method according to claim 7 wherein said isolation areas comprise shallow trench isolation.

10. The method according to claim 7 wherein said conducting layer comprises polysilicon.

11. The method according to claim 7 wherein said conducting layer comprises amorphous silicon.

12. The method according to claim 7 further comprising:

implanting second ions to form lightly doped source and drain regions within said semiconductor substrate associated with said gate electrode and said high voltage device;

forming spacers on the sidewalls of said gate electrode and said high voltage device;

implanting third ions to form heavily doped source and drain regions within said semiconductor substrate associated with said gate electrode and said high voltage device; and siliciding said gate electrode, said high voltage device, and said associated source and drain regions.

13. The method according to claim 7 wherein said step of implanting first ions comprising implanting phosphorus ions with a dosage of between about 5 E 12 and 5 E 14 atoms/cm$^2$ and energy of between about 40 and 200 KeV.

14. The method according to claim 7 wherein said step of implanting first ions comprising implanting boron ions with a dosage of between about 5 E 12 and 5 E 14 atoms/cm$^2$ and energy of between about 40 and 200 KeV.

15. A method of fabricating an integrated circuit device wherein a low voltage device area and a high voltage device area are fabricated on the same wafer comprising:

forming isolation areas on a semiconductor substrate surrounding and electrically isolating said device areas, said device areas being said low voltage device area and said high voltage device area;

providing a gate oxide layer in said device areas;

depositing a first conducting layer overlying said gate oxide layer and said isolation areas;

forming a first photomask over a portion of said high voltage device area wherein said first photomask also completely covers said low voltage device area;

etching away said conducting layer not covered by said first photomask to form said high voltage device;

thereafter implanting first ions to form lightly doped source and drain regions within said semiconductor substrate adjacent to said high voltage device wherein said first photomask protects said conducting layer in said low voltage device area from said ions;

removing said first photomask;

forming a second photomask over a portion of said low voltage device area where a gate electrode is to be formed wherein said second photomask also completely covers said high voltage device area;

etching away said conducting layer not covered by said second photomask to form said gate electrode;

removing said second photomask;

implanting second ions to form lightly doped source and drain regions within said semiconductor substrate associated with said gate electrode and said high voltage device;

forming spacers on the sidewalls of said gate electrode and said high voltage device;

implanting third ions to form heavily doped source and drain regions within said semiconductor substrate associated with said gate electrode and said high voltage device; and siliciding said gate electrode, said high voltage device, and said associated source and drain regions to complete the fabrication of said integrated circuit device.

16. The method according to claim 15 wherein said conducting layer comprises polysilicon.

17. The method according to claim 15 wherein said conducting layer comprises amorphous silicon.

18. The method according to claim 15 wherein said step of implanting first ions comprising implanting phosphorus ions with a dosage of between about 5 E 12 and 5 E 14 atoms/cm$^2$ and energy of between about 40 and 200 KeV.

19. The method according to claim 15 wherein said step of implanting first ions comprising implanting boron ions with a dosage of between about 5 E 12 and 5 E 14 atoms/cm$^2$ and energy of between about 40 and 200 KeV.

20. The method according to claim 15 wherein said low voltage device area is a logic device area and wherein said high voltage device area is an embedded memory area.

* * * * *

UNITED STATES PATENT AND TRADEMARK OFFICE
CERTIFICATE OF CORRECTION

PATENT NO. : 6,110,782
DATED : August 29, 2000
INVENTOR(S) : Wen-Ting Chu, Chuan-Li Chang, Ming-Chou Ho, Chang-Song Lin, Di-Son Kuo It is certified that error appears in the above-identified patent and that said Letters Patent is hereby corrected as shown below:

On the Title page, item (75), please delete "Wen-Ting Chu, Kaoshiung; Chuan-Li Chang, Hsin-Chu; Ming-Chon Ho, Taichuang; Chang-Song Lin, Hsin-Chu; Di-SonKwo, Hsinchu, all of Taiwan" and replace it with --Wen-Ting Chu, Kaoshiung; Chuan-Li Chang, Hsin-Chu; Ming-Chou Ho, Taichuang; Chang-Song Lin, Hsin-Chu; Di-Son Kuo, Hsinchu, all of Taiwan--.

Signed and Sealed this

First Day of May, 2001

Attest:

NICHOLAS P. GODICI

Attesting Officer        Acting Director of the United States Patent and Trademark Office